United States Patent
Kiyota

(10) Patent No.: US 10,263,387 B2
(45) Date of Patent: Apr. 16, 2019

(54) LIGHT EMITTING DEVICE

(71) Applicant: NICHIA CORPORATION, Anan-shi, Tokushima (JP)

(72) Inventor: Seiji Kiyota, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/499,021

(22) Filed: Apr. 27, 2017

(65) Prior Publication Data
US 2017/0317469 A1    Nov. 2, 2017

(30) Foreign Application Priority Data

Apr. 28, 2016    (JP) ................... 2016-090768

(51) Int. Cl.
*H01S 5/00*    (2006.01)
*H01S 5/022*   (2006.01)
*H01S 5/40*    (2006.01)

(52) U.S. Cl.
CPC ...... *H01S 5/02292* (2013.01); *H01S 5/02276* (2013.01); *H01S 5/02296* (2013.01)

(58) Field of Classification Search
CPC .... H01S 5/02276; H01S 5/02296; H01S 5/40; H01S 5/00; F21V 5/04; F21V 9/16; F21K 9/64
USPC ........... 372/44.01, 43.01, 54, 21; 362/84; 259/269; 257/98
See application file for complete search history.

(56) References Cited

U.S. PATENT DOCUMENTS

| | | | |
|---|---|---|---|
| 6,970,489 B2 * | 11/2005 | Shimonaka | B82Y 20/00 257/E31.108 |
| 8,274,209 B2 * | 9/2012 | Wada | F21K 9/00 257/269 |
| 2009/0003400 A1 | 1/2009 | Nagahama et al. | |
| 2011/0049550 A1 * | 3/2011 | Katsuno | H01L 33/405 257/98 |
| 2014/0225151 A1 * | 8/2014 | Jung | H01L 33/641 257/99 |
| 2014/0362885 A1 * | 12/2014 | Sakuta | H01L 33/50 372/44.01 |
| 2015/0307717 A1 * | 10/2015 | Kojima | H01L 33/60 257/98 |

(Continued)

FOREIGN PATENT DOCUMENTS

| | | |
|---|---|---|
| JP | 2007-123576 A | 5/2007 |
| JP | 2008-210960 A | 9/2008 |

(Continued)

*Primary Examiner* — Tuan N Nguyen
(74) *Attorney, Agent, or Firm* — Global IP Counselors, LLP

(57) ABSTRACT

A light-emitting device includes: a base having a depressed portion upwardly opening, the depressed portion having a bottom surface, surrounding surfaces and at least one placement surface disposed at a position higher than the bottom surface; at least one semiconductor laser element mounted on or above the bottom surface; and a wavelength conversion member enclosed in the depressed portion to convert a wavelength of light from the at least one semiconductor laser element, the wavelength conversion member having a lower surface disposed on the at least one placement surface and a circumferential edge partly surrounded by the surrounding surfaces.

14 Claims, 6 Drawing Sheets

(56) References Cited

U.S. PATENT DOCUMENTS

2016/0056345 A1\* 2/2016 Park .................... H01L 25/0756
257/88

FOREIGN PATENT DOCUMENTS

| JP | 2009-170723 A | 7/2009 |
| JP | 2014-154723 A | 8/2014 |
| WO | 2007-105647 A1 | 9/2007 |

\* cited by examiner

LIGHT EMITTING DEVICE

CROSS-REFERENCE TO RELATED APPLICATION

This application claims priority to Japanese Patent Application No. 2016-090768, filed on Apr. 28, 2016, the disclosure of which is hereby incorporated by reference in its entirety.

BACKGROUND

The present invention relates to a light-emitting device. A light-emitting device having a laser element and a wavelength conversion member mounted in a package which is encapsulated with a cap has been proposed. In such a light-emitting device, normally, laser light passes the wavelength conversion member and is extracted outside. Consequently, in normal operation, the output light is generally non-laser light.

SUMMARY

In this kind of light-emitting device, however, when abnormality such as detachment of the secured wavelength conversion member occurs, laser light may be unfortunately extracted directly outside. Therefore, there has been a demand for a laser-light safety measures to prevent the laser light from being extracted directly outside even if the wavelength conversion member comes off.

A light-emitting device according to an embodiment of the present disclosure includes: a base having a depressed portion upwardly opening, the depressed portion having a bottom surface, surrounding surfaces and at least one placement surface disposed at a position higher than the bottom surface; at least one semiconductor laser element mounted on or above the bottom surface; and a wavelength conversion member enclosed in the depressed portion to convert a wavelength of light from the at least one semiconductor laser element, the wavelength conversion member having a lower surface disposed on the at least one placement surface and a circumferential edge partly surrounded by the surrounding surfaces.

According to the present disclosure, it is possible to provide the light-emitting device in which the wavelength conversion member can be reduced in size, and when the wavelength conversion member is displaced, an optical path of the laser light is shielded to prevent the laser light from leaking outside.

DETAILED DESCRIPTION OF EMBODIMENTS

The following embodiments are provided for exemplary purposes to embody the subject matter of the present invention and are not intended to limit the present invention to the following. There are cases where magnitudes or positional relations of members illustrated in each drawing are exaggerated so as to clarify the descriptions. In principle, the same term or reference number represents the same or homogenous member, and therefore its descriptions are appropriately omitted to avoid overlapping.

First Embodiment: Light-Emitting Device

Figure 1A:
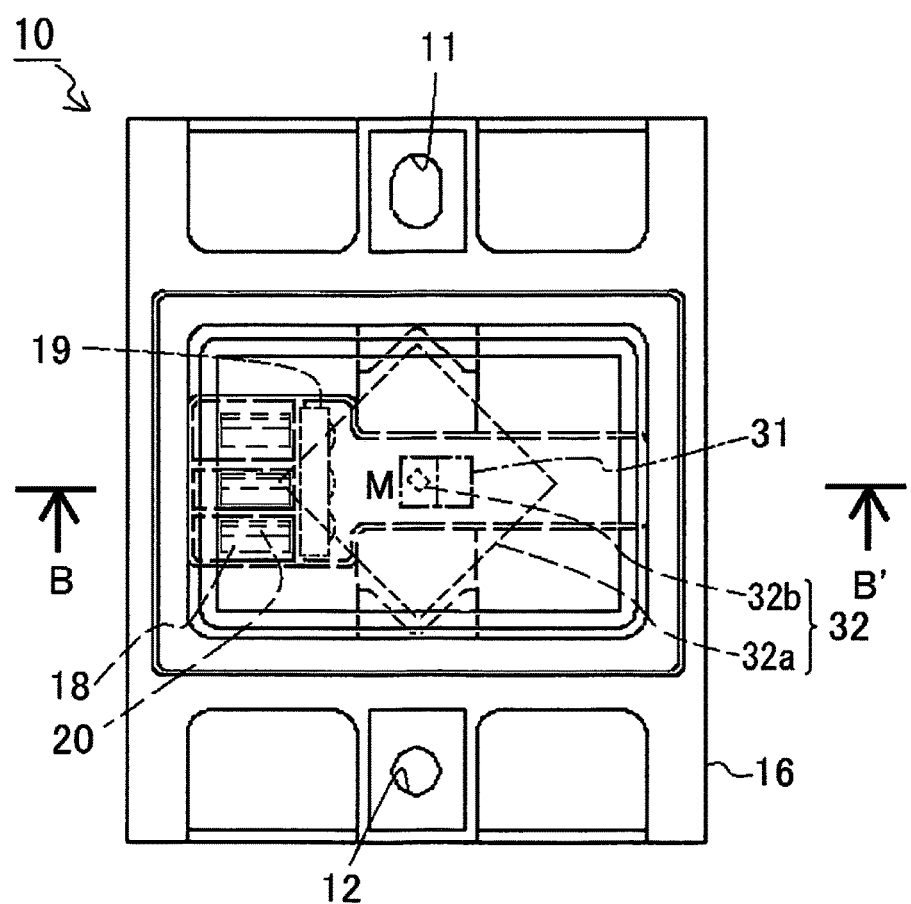
FIG. 1A is a schematic plan view of a light-emitting device of a first embodiment.
Figure 1B:
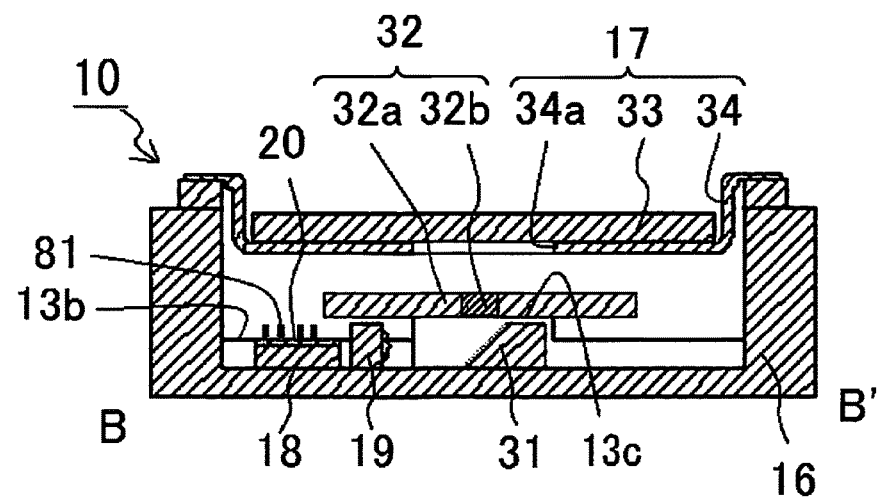
FIG. 1B is a schematic cross-sectional view taken along line B-B' in FIG. 1A.
Figure 2:
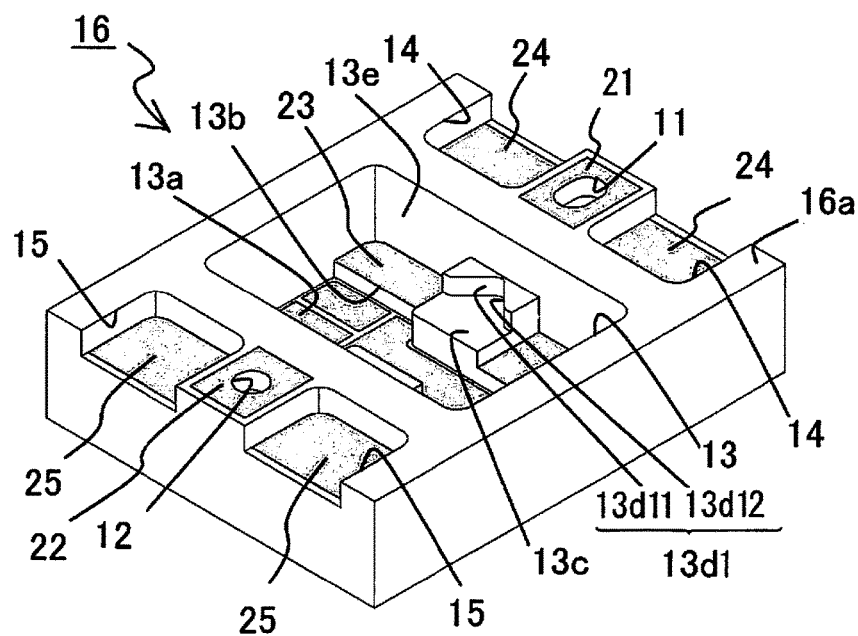
FIG. 2 is a schematic perspective view of a base that constitutes the light-emitting device in FIG. 1A.
Figure 3A:
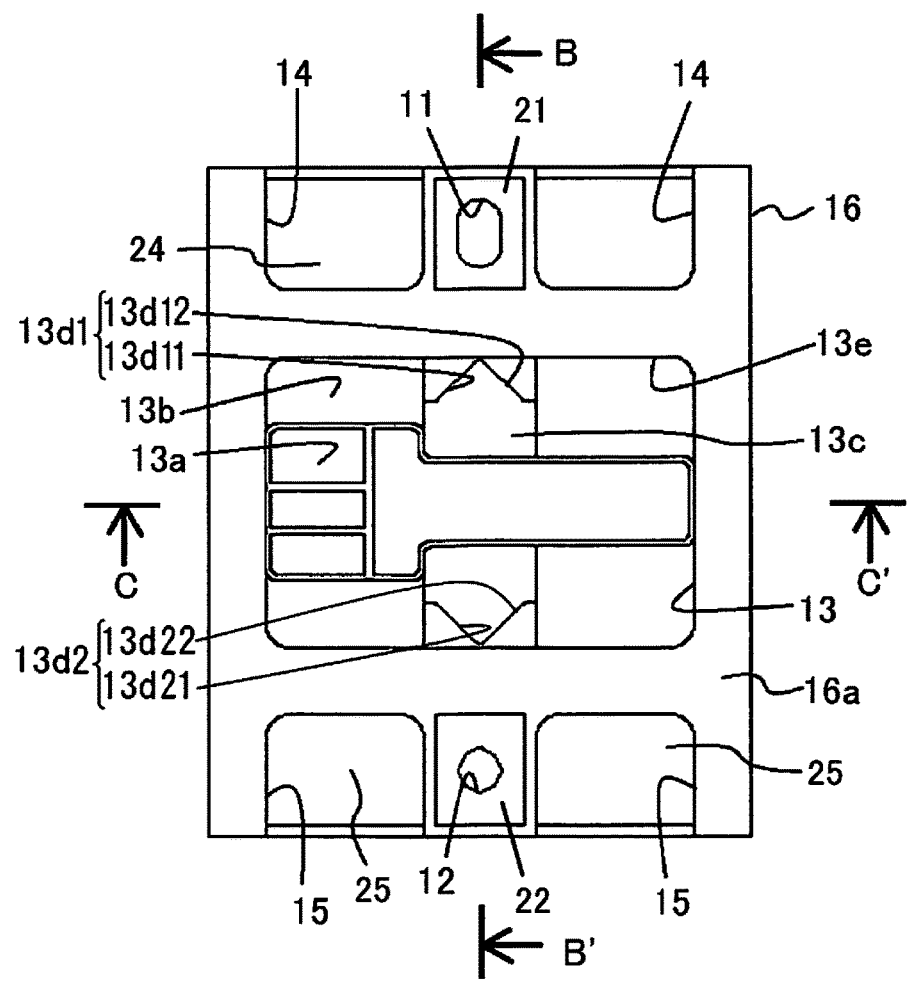
FIG. 3A is a schematic plan view of the base that constitutes the light-emitting device in FIG. 1A.
Figure 3B:
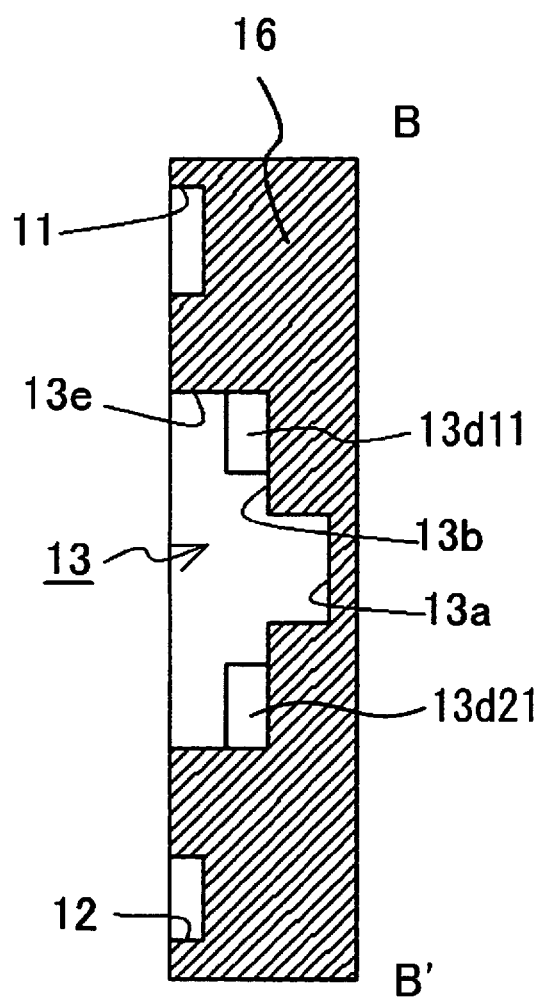
FIG. 3B is a schematic cross-sectional view taken along line B-B' in FIG. 3A.
Figure 3C:
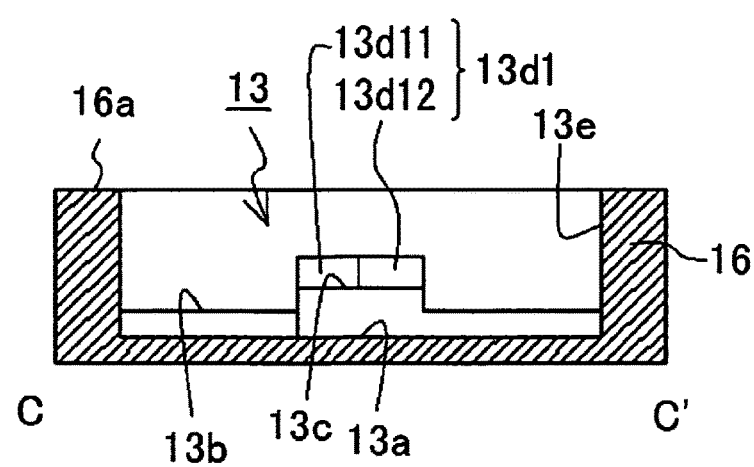
FIG. 3C is a schematic cross-sectional view taken along line C-C' in FIG. 3A.

As illustrated in FIGS. 1A and 1B, a light-emitting device 10 of this embodiment includes a semiconductor laser element 20, a wavelength conversion member 32 to convert the wavelength of light from the semiconductor laser element 20, and a base 16 including a depressed portion 13 upwardly opening. The wavelength conversion member 32 is enclosed in the depressed portion 13. As illustrated in FIGS. 2 and 3A to 3C, the depressed portion 13 includes a bottom surface 13a, placement surfaces 13c on which a lower surface of the wavelength conversion member 32 is disposed at higher positions than the bottom surface 13a, and surrounding surfaces 13d1 and 13d2 to partly surround a circumferential edge of the wavelength conversion member 32. The semiconductor laser element 20 is mounted on or above the bottom surface 13a.

(Wavelength Conversion Member 32)

The wavelength conversion member 32 is a member to convert the wavelength of laser light emitted from the semiconductor laser element 20. The wavelength conversion member 32 has the lower surface held by the placement surfaces 13c in the depressed portion 13 and has the circumferential edge partly surrounded by the surrounding surfaces 13d1 and 13d2.

The wavelength conversion member 32 includes a fluorescent-material-containing member 32b that contains a fluorescent material, and a holding member 32a to hold the fluorescent-material-containing member 32b in a through hole. In the wavelength conversion member 32, the fluorescent-material-containing member 32b is located at a position overlapping a light emitting point in a plan view of the light-emitting device 10. Heat generated in the fluorescent-material-containing member 32b is dissipated through the holding member 32a. Here, an exit point of light or the light emitting point refers to a point where light is emitted at the maximum intensity from the light-emitting device or an area in the vicinity of the point.

As the fluorescent-material-containing member 32b, for example, a sintered body may be used. As the sintered body, a material made by sintering a fluorescent material itself or a material made by adding a sintering agent to a fluorescent material and sintering the mixture may be used. It is preferable that a material from which white light can be obtained in combination with the semiconductor laser element 20 be selected as the fluorescent material. For example, in the case where blue light is emitted from the semiconductor laser element 20, a fluorescent material that emits yellow light with the outgoing light from the semiconductor laser element 20 serving as excitation light may be used. As the fluorescent material that emits yellow light, a YAG fluorescent material may be used. In the case where light (for example ultraviolet rays) having a shorter wavelength than blue light is emitted from the semiconductor laser element 20, fluorescent materials that emit blue light, green light, and red light may be used.

In order to have good heat dissipation from the fluorescent-material-containing member 32b, it is preferable that a material having high thermal conductivity be used for the holding member 32a. As such a material, for example, metal including copper, copper alloys, iron, and ferroalloys, or ceramic including aluminum nitride or aluminum oxide may be included. It is preferable that the holding member 32a have a light-shielding property with respect to the laser light emitted by the semiconductor laser element 20. Specifically, it is preferable that the holding member 32a be a member capable of reflecting and/or absorbing the laser light. Thus, when the fluorescent-material-containing member 32b is displaced from an optical path of the laser light, the holding member 32a can shield the laser light, that is, reflect and/or absorb the laser light. Therefore, even if the fluorescent-material-containing member 32b comes off the holding surface for some reason and is displaced from the optical path of the laser light, the holding member 32a is located in the optical path of the laser light so as to prevent the laser light from leaking outside.

The wavelength conversion member 32 can be made to have a size that covers 5% to 40% of the depressed portion 13 in a plan view. Since the light-emitting device 10 includes the surrounding surfaces 13d1 and 13d2, a movable range of the wavelength conversion member 32 when the wavelength conversion member 32 comes off can be narrowed. It is preferable that the wavelength conversion member 32 have such a size and shape that the wavelength conversion member 32 is not in contact with the surrounding surfaces 13d1 and 13d2 in a plan view. Thus, even if misalignment occurs at the time of the manufacturing, the wavelength conversion member 32 can be prevented from coming into contact with the surrounding surfaces 13d1 and 13d2 so as to facilitate mounting of the wavelength conversion member 32.

In this embodiment, the wavelength conversion member 32 is substantially rectangular in a plan view and includes a first corner and a second corner that are opposed to each other. Although the wavelength conversion member 32 in a plan view may have various shapes, for example, a polygon such as a quadrilateral, a circle, and an oval, a polygon such as a quadrilateral, which can be readily manufactured, is preferable. The size of the through hole in which the fluorescent-material-containing member 32b is disposed can be adjusted as desired in accordance with a spot diameter of laser light emitted to the wavelength conversion member 32. For example, the size of the through hole may be 1 time or more or 1.5 times or more as large as the spot diameter. It is preferable that the thickness of the wavelength conversion member 32 be such a thickness as to secure an appropriate amount of the fluorescent material in the fluorescent-material-containing member in the through hole, for example, approximately 0.2 mm to 1 mm.

(Mounting Board 16)

A material and a shape of the base 16 are selected to mount the semiconductor laser element 20 on the base 16. The base 16 may be formed of, for example, metal, glass, or ceramic. In particular, considering corrosion resistance and a heat dissipation property, it is preferable that the base 16 be mainly formed of ceramic. As the ceramic, for example, aluminum nitride and aluminum oxide may be used. Aluminum nitride is preferable because it excels in corrosion resistance and the heat dissipation property. As a plane shape of the base 16, various shapes, such as a circle, an oval, and a polygon may be included. For example, the plane shape of the base 16 is substantially rectangular. It should be noted that a plane shape refers to an external shape in a plan view. In the case where an upper surface 16a of the base 16 is regarded as an upper side, and a bottom surface of the base 16 is regarded as a lower side, a plan view refers to observation from above, that is, in a direction substantially perpendicular to the upper surface 16a.

As illustrated in FIGS. 2 and 3A to 3C, the base 16 includes the depressed portion 13 upwardly opening. The depressed portion 13 is connected to the upper surface 16a of the base 16. The upper surface 16a of the base 16 refers to the uppermost surface among a plurality of surfaces of the base 16. The depressed portion 13 can be used for mounting the semiconductor laser element 20 and for electrically connecting the semiconductor laser element 20 with wiring. Also, the depressed portion 13 can be used for mounting a member to reflect, convert in wavelength or diffuse light of the semiconductor laser element 20 and for encapsulating the semiconductor laser element 20. The depressed portion 13 may include connecting surfaces 13b and lateral surfaces 13e in addition to the bottom surface 13a, the placement surfaces 13c, and the surrounding surfaces 13d1 and 13d2, as described above.

The bottom surface 13a is a surface on which the semiconductor laser element 20 is mounted, and is located at the lowermost position of the depressed portion 13, for example. It is preferable that the bottom surface 13a be substantially in parallel to the upper surface 16a and the lower surface of the base 16. This facilitates mounting of components such as the semiconductor laser element 20. The bottom surface 13a may have a plane area of 5% to 25% of the plane area of the light-emitting device 10 or may have a plane area of 20% to 65% of the plane area of the depressed portion 13. In the present application, being substantially in parallel means that an inclination is in the range of plus or minus approximately 1 degree.

The connecting surfaces 13b are surfaces on each of which a wiring layer 23 is disposed. The wiring layers 23 are electrically connected to the semiconductor laser element 20 through, for example, wire 81. In a plan view, the connecting surfaces 13b may be located on both sides of the bottom surface 13a so as to be adjacent to the semiconductor laser element 20. This facilitates wire connection between the semiconductor laser element 20 and the connecting surfaces 13b. It is preferable that an upper surface of the wiring layer 23 disposed on the connecting surface 13b be substantially in parallel to the bottom surface 13a. This facilitates connection of the wire 81 to the wiring layer 23. For example, the size of the connecting surfaces 13b may have a plane area of 20% to 75% of the plane area of the depressed portion 13 or may have a plane area of 50% to 250% of the plane area of the bottom surface 13a.

The wiring layer 23 may be formed of a single layer or a plurality of layers of one or more of copper, gold, silver, aluminum, titanium, platinum, nickel, palladium, and alloys of these metals. It is preferable that the connecting surfaces 13b be on an upper side of the bottom surface 13a. Thus, the length of the wire 81 electrically connected to the semiconductor laser element 20 can be decreased to reduce electric resistance. Also, the connection to components such as the semiconductor laser element 20 through the wire 81 can be readily performed. It is preferable that the connecting surfaces 13b be as high as the upper surface of the semiconductor laser element 20 in the case where the semiconductor laser element is mounted on or above the bottom surface 13a. This further decreases the length of the wire 81.

The placement surfaces 13c are surfaces used for securing the lower surface of the wavelength conversion member 32. The wavelength conversion member 32 is secured to the placement surfaces 13c through paste material containing Ag and Au, solder material such as AuSn, or bonding material such as Ag particles and Au particles. It is preferable that the placement surfaces 13c be in parallel to the bottom surface 13a. Thus, the lower surface of the wavelength conversion member 32 can be held in a state substantially perpendicular to the optical axis of incident laser light. It is also preferable that the placement surfaces 13c be on an upper side of the connecting surfaces 13b. Thus, when the semiconductor laser element is connected to the wiring layers 23 through the wire 81, possibility of the wire 81 coming into contact with the wavelength conversion member 32 can be reduced. Since the placement surfaces 13c are closer to a lid 17, a movable range of the wavelength conversion member 32 in the height direction can be reduced.

It is preferable that the placement surfaces 13c have such an area and plane shape to come into contact with the wavelength conversion member 32 so that the wavelength conversion member 32 can be disposed on the placement surfaces 13c. The area of the placement surfaces 13c may be, for example, 10% to 30% of the plane area of the depressed portion 13. Also, the area of the placement surfaces 13c may be an area that comes into contact with 20% to 60% of the plane area of the wavelength conversion member 32. Alternatively, the area of the placement surfaces 13c may be an area that satisfies both of these two conditions. For example, as a plane shape of the placement surfaces 13c, a polygon or a polygon with round corners may be used.

The surrounding surfaces 13d1 and 13d2 are on an upper side of the placement surfaces 13c and adjacent to the placement surfaces 13c. In order to surround a circumferential edge of the wavelength conversion member held on the placement surfaces 13c, the surrounding surfaces 13d1 and 13d2 are located to be opposed to the circumferential edge. That is, the surrounding surfaces 13d1 and 13d2 are located in a standing state on the placement surfaces 13c. It is preferable that the surrounding surface 13d1 and 13d2 be at such an angle with respect to the placement surface 13c as to accord with a state of a side surface of the wavelength conversion member 32 that includes the circumferential edge, that is, as to make the surrounding surface 13d1 and 13d2 substantially parallel to the side surface of the wavelength conversion member 32. Specifically, the angle of the surrounding surface 13d1 and 13d2 with respect to the placement surface 13c may be approximately 60 degrees to 120 degrees, preferably, approximately 80 degrees to 100 degrees, and more preferably, approximately 90 plus or minus several degrees. The surrounding surface 13d1 and 13d2 may be formed as an independent member from the lateral surface 13e. In view of size reduction of the light-emitting device, however, it is preferable that the surrounding surface 13d1 and 13d2 protrude from the lateral surface 13e inside the depressed portion 13, that is, the surrounding surface 13d1 and 13d2 be formed continuously from the lateral surface 13e.

The surrounding surfaces 13d1 and 13d2 partly surround the circumferential edge of the wavelength conversion member 32. The surrounding length may be adjusted as desired in accordance with a plane shape of the wavelength conversion member 32. In the case where the plane shape of the wavelength conversion member 32 is substantially polygonal, it is preferable that the surrounding surfaces 13d1 and 13d2 have such a shape as to surround two or more corners. This narrows a movable range of the wavelength conversion member 32 when the wavelength conversion member 32 is detached from the placement surfaces 13c. For example, in the case where the plane shape of the wavelength conversion member 32 is quadrilateral, it is possible to select surrounding one corner, two corners, three corners, or all the corners. Surrounding a corner refers to continuously surrounding, at least in the vicinity of the corner, two sides that constitute the corner. In the case where the wavelength conversion member 32 has a shape other than a quadrilateral, the surrounding surfaces 13d1 and 13d2 may surround portions corresponding to these corners. The surrounding length may be, for example, 20% to 80% or 20% to 50% of the length of the circumferential edge of the wavelength conversion member 32.

In this embodiment, as described above, the wavelength conversion member 32 has a substantially rectangular shape having the first corner and the second corner that are opposed to each other. The surrounding surfaces include a first surrounding surfaces 13d1 to surround the first corner and a second surrounding surfaces 13d2 to surround the second corner. The first surrounding surfaces 13d1 include a surface 13d11 and a surface 13d12. The second surrounding surfaces 13d2 include a surface 13d21 and a surface 13d22.

In FIGS. 1A to 3C, the wavelength conversion member 32 is substantially quadrilateral in a plan view. The two corners of the wavelength conversion member 32 that are opposed to each other are located to be opposed to the lateral surfaces of the depressed portion 13. These two corners and their neighboring portions are supported by the placement surfaces 13c. First corner of these two corners and portions of the two sides that are adjacent to the first corner in the vicinity of the first corner alone are surrounded by the surrounding surfaces standing upright on the placement surfaces 13c, that is, the first surrounding surfaces 13d1 (surfaces 13d11 and 13d12). Second corner of these two corners and portions of the two sides that are adjacent to the second corner in the vicinity of the second corner alone are surrounded by the surrounding surfaces standing upright on the placement surfaces 13c, that is, the second surrounding surfaces 13d2 (surfaces 13d21 and 13d22). Approximately ⅓ of the lower surface of the wavelength conversion member 32 is supported/secured on the placement surfaces 13c. Approximately half of an outer edge of the wavelength conversion member 32 is surrounded by the surrounding surfaces 13d1 and 13d2 at an interval of approximately 300 μm.

The placement surfaces 13c and the surrounding surfaces 13d1 and 13d2 can narrow the movable range of the wavelength conversion member 32 in the horizontal and vertical directions of the light-emitting device 10 in a plan view. Thus, the wavelength conversion member 32 can be supported at an appropriate position so as to prevent the laser light from leaking due to displacement of the wavelength conversion member 32. In order to prevent the laser light from leaking more reliably, it is preferable that the surrounding surfaces 13d1 and 13d2 have such a size and positions and the wavelength conversion member 32 have such a size and shape that the wavelength conversion member 32 can shield the optical path of the laser light even if the wavelength conversion member 32 is displaced to the maximum extent. It is also preferable that a distance from the placement surfaces 13c to the lid 17 be such a distance that the wavelength conversion member 32 can shield the optical path of the laser light even if the wavelength conversion member 32 is displaced to the maximum extent. Thus, it is possible to more reliably prevent the laser light from leaking due to displacement of the wavelength conversion member 32.

The surrounding surfaces 13d1 and 13d2 may surround all of the wavelength conversion member 32 in the thickness direction or may partly surround the wavelength conversion member 32 in the thickness direction. The width of the surrounding surface 13d1 and 13d2 (dimension in the height direction of the light-emitting device 10) may be, for example, 10% to 150%, 20% to 120%, or 50% to 100% of the wavelength conversion member 32. It is preferable that the minimum distance from the surrounding surfaces 13d1 and 13d2 to the lid 17 be smaller than the thickness of the wavelength conversion member 32. This can prevent the wavelength conversion member 32 from moving over the surrounding surfaces 13d1 and 13d2.

Plane shapes of the depressed portion 13, the bottom surface 13a, the placement surfaces 13c, and the surrounding surfaces 13d1 and 13d2 are, for example, polygons or polygons with round corners. The bottom surface 13a, the connecting surfaces 13b, the placement surfaces 13c, and the surrounding surfaces 13d1 and 13d2 are located in different areas in a plan view, for example. A height difference between the bottom surface 13a and the connecting surfaces 13b and a height difference between the connecting surfaces 13b and the placement surfaces 13c can be adjusted by green sheets of the ceramic layers layer by layer. The thickness of each layer of the ceramic layers is, for example, approximately 100 μm to 500 μm.

The lateral surface 13e connects the bottom surface 13a and the connecting surface 13b to the upper surface 16a of the base 16. For example, the lateral surface 13e is inclined at approximately 60 degrees to 120 degrees with respect to these surfaces. The lateral surfaces 13e may have different inclination angles at different positions. For example, a metal frame is joined onto part of the upper surface 16a of the base 16 at the outer circumference of the depressed portion 13, and the lid 17 described later is joined onto this metal frame by welding so as to encapsulate the semiconductor laser element.

The base 16 may further include a first depressed portion 11 and a second depressed portion 12 that are upwardly opening. In assembling the light-emitting device 10, the first depressed portion 11 and the second depressed portion 12 can be used as marks that determine positioning reference points for mounting the semiconductor laser element 20 on the base 16. In the case of assembling the light-emitting device 10 as a laser module, the first depressed portion 11 and the second depressed portion 12 can be used for positioning with members other than the light-emitting device 10. It is preferable that the first depressed portion 11 and the second depressed portion 12 not penetrate the base 16. Thus, in the case where the base 16 is formed of a material mainly including ceramic, misalignment caused by laminating and sintering a plurality of green sheets of the ceramic layers can be reduced, and the first depressed portion 11 and the second depressed portion 12 can be formed highly accurately. Since a decrease in the bottom area of the base 16 can be avoided, it is possible to secure a larger area serving for heat dissipation.

It is preferable that the base 16 include a first metal layer 21 and a second metal layer 22 on the upper surface 16a. The first metal layer 21 and the second metal layer 22 are respectively adjacent to the first depressed portion 11 and the second depressed portion 12 in a plan view and connected to the first depressed portion 11 and the second depressed portion 12. These metal layers facilitate image recognition of the first depressed portion 11 and the second depressed portion 12 in a manufacturing procedure of the light-emitting device 10. Specifically, the first metal layer 21 and the second metal layer 22 are different in color tones from and present a high contrast to the ceramic layers exposed from the first metal layer 21 and the second metal layer 22. Consequently, inner edges of the first metal layer 21 and the second metal layer 22, namely, outer edges of the first depressed portion 11 and the second depressed portion 12 can be readily recognized.

The base 16 further includes external electrodes 24 and 25. The base 16 may further include a fourth depressed portion 14 and a fifth depressed portion 15 in which the external electrodes 24 and 25 are respectively disposed. The external electrodes 24 and 25 are electrically connected to the wiring layers 23 in the depressed portion 13 through inner-layer wiring, for example, disposed inside the base 16. The external electrodes 24 and 25 may be formed of a single layer or a plurality of layers of one or more of, for example, copper, gold, silver, aluminum, titanium, platinum, nickel, palladium, and alloys of these metals. It is preferable that the external electrodes 24 and 25 be made of the same material as the wiring layers 23 because the external electrodes 24 and 25 can be formed by the same procedure.

The base 16 includes the first depressed portion to the fifth depressed portion 11, 12, 13, 14, and 15, and includes portions at different heights such as the upper surface 16a, the bottom surface 13a, the connecting surfaces 13b, the placement surfaces 13c, the surrounding surfaces 13d1 and 13d2, and bottom surfaces of the fourth depressed portion 14 and the fifth depressed portion 15. Such a base 16 is mainly made of, for example, ceramic. In this case, these surfaces are made of a plurality of layers of green sheets, and openings to expose other surfaces are formed, and these surfaces are laminated. Thus, it is possible to obtain the base 16 having gradual steps corresponding to the positions of these surfaces from the lowermost surface (the bottom surface 13a of the depressed portion 13) to the upper surface 16a of the base 16. In the case where the base 16 is mainly made of metal, methods such as presswork and pressing are combined to obtain the base 16 having the gradual steps.

(Semiconductor Laser Element 20)

As the semiconductor laser element 20, for example, an element including a semiconductor layer of nitride semiconductor (mainly represented by general formula $In_xAl_yGa_{1-x-y}N$, $0 \le x$, $0 \le y$, $x+y \le 1$) may be included. By adjusting the composition of the nitride semiconductor, the emission wavelength of the semiconductor laser element 20 can be adjusted. A semiconductor laser element having an emission wavelength, for example, in a range of 400 nm to 530 nm can be used. To be combined with YAG fluorescent material, a semiconductor laser element 20 having an emission wavelength in a range of 420 nm to 490 nm is preferable.

It is preferable that a laser-light emission surface of the semiconductor laser element 20 be arranged to be substantially perpendicular to the bottom surface 13a of the depressed portion 13 of the base 16. Since a reflective member 31 described later is required for making the laser light reach the lid 17, this arrangement can prevent the laser light from being emitted directly outside when the reflective member 31 is detached and displaced from the optical path of the laser light. Thus, even if other members are also detached when the reflective member 31 is detached, the laser light is prevented from being extracted directly outside.

Although the semiconductor laser element may be directly disposed on the bottom surface 13a, it is preferable that the semiconductor laser element be disposed on the bottom surface 13a through a submount 18. Thus, a light emission surface of the semiconductor laser element 20 can be separated from the bottom surface 13a so as to prevent the light from the semiconductor laser element 20 from reaching the bottom surface 13a. As the submount 18, for example, silicon carbide or aluminum nitride may be used. In the case where the submount 18 is disposed, it is preferable that the semiconductor laser element 20 be mounted in such a manner that the emitted light advances in a direction substantially in parallel to the bottom surface 13a.

(Reflective Member 31)

It is preferable that the light-emitting device 10 further include the reflective member 31.

The reflective member 31 is disposed on the bottom surface 13a of the depressed portion 13 and at such a position that the reflective member 31 can reflect the light from the semiconductor laser element 20. The reflective member 31 includes a reflective surface inclined with respect to the bottom surface 13a, and is arranged in such a manner that this reflective surface reflects the light from the semiconductor laser element 20 upward. It is preferable that the reflective member 31 be arranged at such a position that light reflected by the reflective member 31 overlaps the light emitting point in a plan view. For example, the reflective member 31 is arranged in such a manner that the reflective surface is located directly under the fluorescent-material-containing member 32b.

As the reflective member 31, for example, a member of optical glass having a triangular prism shape or a quadrangular pyramid shape and having an inclined surface on which a reflective film is coated may be used. An angle between the bottom surface 13a and the inclined surface of the reflective member 31 may be, for example, 30 degrees to 60 degrees, and approximately 45 degrees is preferable. Thus, the laser light, which advances substantially in parallel to the bottom surface 13a, can be changed to advance in a direction substantially perpendicular to the bottom surface 13a. Each light-emitting device may include only one reflective member 31 or may include a plurality of reflective members. In the case where one light-emitting device includes a plurality of semiconductor laser elements, the light-emitting device may include a plurality of reflective members.

(Cover 17)

It is preferable that the light-emitting device 10 further include the lid 17.

In order to encapsulate the semiconductor laser element 20 mounted in the depressed portion 13, for example, the lid 17 covers the opening of the depressed portion 13 and is joined onto the base 16. In this case, it is preferable that the lid 17 be joined onto the base 16 at such a position that the lid 17 does not overlap the first depressed portion 11 and the second depressed portion 12 in a plan view. This can prevent the lid 17 from becoming an obstacle of image recognition. Although the lid 17 can be connected to the base 16 by using, for example, silver solder, it is preferable that a metal frame be disposed on the upper surface of the base 16, and the lid 17 be welded on this metal frame. Thus, encapsulating with improved airtightness can be performed.

The lid 17 includes a light-transmissive member 33 that transmits the light, which has passed the wavelength conversion member 32, preferably upward. The light-transmissive member 33 may be made of, for example, glass. It is preferable that the lid 17 include a holding member 34 having a through hole 34a so as to hold/secure the light-transmissive member 33. It is preferable that an opening area of the through hole 34a on the light incidence side be larger than an opening area of the through hole of the wavelength conversion member 32 on the light emission side. In order to cover the through hole 34a of the holding member 34 of the lid 17, for example, the light-transmissive member 33 is secured inside the through hole 34a of the holding member 34 of the lid 17 or to a surface of the holding member 34 of the lid 17 on a side opposite to the wavelength conversion member 32 side. Metal including KOVAR®, for example, may be used for the holding member 34.

In the case where the lid 17 includes the light-transmissive member 33 and the holding member 34, the base 16 and the holding member 34 can be secured to each other by welding. In the case of welding, the light-transmissive member 33 and the base 16 can be reliably secured to each other. This can provide the light-emitting device 10 in which the lid 17 is prevented from coming off the base 16 even if the light-emitting device 10 receives an impact such as vibration. It is preferable that the holding member 34 be a member to shield the laser light emitted from the semiconductor laser element 20. In the case where the light-emitting device 10 includes such a holding member 34, the laser light, which has leaked from a side of the wavelength conversion member 32, can be prevented from being extracted outside.

It is preferable that the holding member 34 include a depressed portion and be secured to the upper surface 16a of the base 16 in such a manner that part of the depressed portion is enclosed in the depressed portion 13 of the base 16. This makes the wavelength conversion member 32 and the lid 17 closer to each other so as to narrow a movable range of the wavelength conversion member 32 in the height direction of the light-emitting device 10. In this case, it is preferable that the through hole 34a of the holding member 34 be formed in a bottom surface of the depressed portion of the holding member 34, and that the light-transmissive member 33 be disposed in the depressed portion of the lid 17. This prevents the light-transmissive member 33 from coming into contact with components other than the light-emitting device 10 so as to reduce damage of the light-transmissive member 33. Since the wavelength conversion member 32 and the light-transmissive member 33 can be made closer to each other, it is possible to increase an amount of light from the wavelength conversion member 32 that passes the light-transmissive member 33 so as to enhance extraction efficiency of the light from the wavelength conversion member 32.

(Lens 19)

The light-emitting device 10 may further include a lens 19. It is preferable that the lens 19 be disposed on the bottom surface 13a of the depressed portion 13 and at such a position that the light from the semiconductor laser element 20 can pass the lens 19. As the lens 19, normally, a lens that condenses the laser light or changes the laser light into parallel light can be used.

Second Embodiment: Light-Emitting Device

Figure 4:
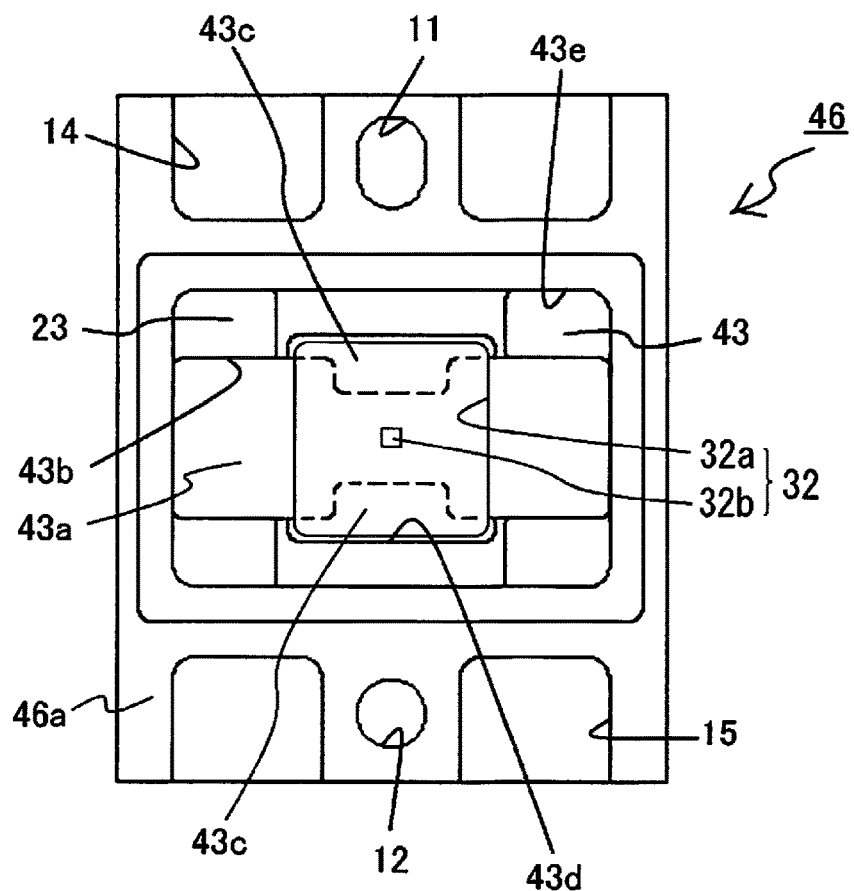
FIG. 4 is a schematic plan view of a base and a wavelength conversion member that constitute a light-emitting device of a second embodiment.

As illustrated in FIG. 4, a light-emitting device of this embodiment includes a bottom surface 43a, placement surfaces 43c, and surrounding surfaces 43d in a depressed portion 43 of a base 46 in a similar manner to the above-described base 16. The placement surfaces 43c are at positions higher than the bottom surface 43a, and the lower surface of the wavelength conversion member 32 is disposed on the placement surfaces 43c. The surrounding surfaces 43d partly surround the circumferential edge of the wavelength conversion member 32. The semiconductor laser element 20 is mounted on or above the bottom surface 43a. The other configuration is substantially the same as the light-emitting device 10 of the first embodiment. That is, it is possible to obtain the light-emitting device in which the lid 17 is joined onto an upper surface 46a of the base 46 so as to encapsulate the semiconductor laser element 20.

In this light-emitting device, the wavelength conversion member 32 having a substantially quadrilateral shape is arranged in the depressed portion 43 having a substantially quadrilateral opening in a plan view in such a manner that sides of the wavelength conversion member 32 and sides of the depressed portion 43 are opposed in parallel to each other. In FIG. 4, four corners of the wavelength conversion member 32 and their neighboring portions are supported by the placement surfaces 43c in a plan view. Two corners of the wavelength conversion member 32 opposed to a lateral surface 43e, a side interposed between these two corners, and part of two sides adjacent to the side alone are surrounded by the surrounding surface 43d standing upright on the placement surface 43c. Approximately ⅓ of the lower surface of the wavelength conversion member 32 is supported and secured by the placement surfaces 43c. Approximately half of the outer edge of the wavelength conversion member 32 is surrounded by the surrounding surfaces 43d at an interval of approximately 300 μm. The wiring layer 23 is disposed on each of the connecting surfaces 43b.

The placement surfaces 43c and the surrounding surfaces 43d can narrow a movable range of the wavelength conversion member 32 in the horizontal and vertical directions of the light-emitting device in a plan view so as to prevent leakage of the laser light due to displacement of the wavelength conversion member 32. In the case of such surrounding surfaces 43d, however, the area of the wiring layer 23 becomes relatively small. In order to increase the area of the wiring layer 23, therefore, it is preferable that the surrounding surfaces 13d1 and 13d2 that surround only the two opposed corners be used as in the first embodiment.

What is claimed is:

1. A light-emitting device comprising:
    a base having a depressed portion upwardly opening, the depressed portion having a bottom surface, a lateral surface extending from the bottom surface to an edge of the opening, a plurality of surrounding surfaces extending along planes generally perpendicular to the bottom surface, and at least one placement surface disposed at a position higher than the bottom surface;
    at least one semiconductor laser element disposed on or above the bottom surface;
    a wavelength conversion member enclosed in the depressed portion to convert a wavelength of light emitted from the at least one semiconductor laser element, the wavelength conversion member having a lower surface disposed on the at least one placement surface; and
    a lid covering the opening of the depressed portion and including a light-transmissive member to transmit light from the wavelength conversion member, the lid being spaced apart from the wavelength conversion member, wherein
    the plurality of surrounding surfaces have at least one first surrounding surface and at least one second surrounding surface that are opposed to each other, with only a first part of a circumferential edge of the wavelength conversion member being surrounded by the first surrounding surface and only a second part of the circumferential edge of the wavelength conversion member being surrounding by the second surrounding surface, and
    the wavelength conversion member is not in contact with the plurality of surrounding surfaces.

2. The light-emitting device according to claim 1,
    wherein in a plan view, the wavelength conversion member is substantially rectangular and has a first corner and a second corner that are opposed to each other, and
    wherein the plurality of surrounding surfaces have the at least one first surrounding surface to surround the first corner and the at least one second surrounding surface to surround the second corner.

3. The light-emitting device according to claim 2, wherein only a part of the circumferential edge of the wavelength conversion member in the vicinity of the first corner and a part of the circumferential edge of the wavelength conversion member in the vicinity of the second corner are surrounded by the plurality of surrounding surfaces.

4. The light-emitting device according to claim 1, further comprising at least one wiring layer,
    wherein the depressed portion has at least one connecting surface at a position higher than the bottom surface and lower than the at least one placement surface, and each of the at least one wiring layer is disposed on each of the at least one connecting surface.

5. The light-emitting device according to claim 1, further comprising a reflective member disposed directly under the wavelength conversion member and on the bottom surface so as to reflect the light emitted from the at least one semiconductor laser element.

6. The light-emitting device according to claim 1,
    wherein the wavelength conversion member has:
        a light-shielding holding member having a through hole; and
        a fluorescent-material-containing member containing a fluorescent material and disposed in the through hole.

7. The light-emitting device according to claim 1,
    wherein the lid has a light-shielding holding member having a through hole to pass the light from the wavelength conversion member, and
    wherein the light-transmissive member is secured to the light-shielding holding member of the lid so as to cover the through hole of the light-shielding holding member of the lid.

8. The light-emitting device according to claim 1, wherein the lid is joined onto the base.

9. The light-emitting device according to claim 1, wherein the lateral surface connects the bottom surface of the depressed portion to an upper surface of the base.

10. The light-emitting device according to claim 1, wherein the wavelength conversion member has a size that covers 5% to 40% of the depressed portion in a plan view.

11. The light-emitting device according to claim 1, wherein a minimum distance from the plurality of surrounding surfaces to the lid is smaller than a thickness of the wavelength conversion member.

12. The light-emitting device according to claim 1, wherein the base is mainly formed of ceramic.

13. The light-emitting device according to claim 1, wherein the semiconductor laser element has an emission wavelength in a range of 400 nm to 530 nm.

14. A light-emitting device comprising:
    a base having a depressed portion upwardly opening, the depressed portion having a bottom surface, a lateral surface extending from the bottom surface to an edge of the opening, a plurality of surrounding surfaces extending along planes generally perpendicular to the bottom surface, and at least one placement surface disposed at a position higher than the bottom surface;

at least one semiconductor laser element disposed on or above the bottom surface;

a wavelength conversion member enclosed in the depressed portion to convert a wavelength of light emitted from the at least one semiconductor laser element, the wavelength conversion member having a lower surface disposed on the at least one placement surface; and a lid covering the opening of the depressed portion and including a light-transmissive member to transmit light from the wavelength conversion member, the lid being spaced apart from the wavelength conversion member, wherein the plurality of surrounding surfaces have at least one first surrounding surface and at least one second surrounding surface that are opposed to each other, with only a first part of a circumferential edge of the wavelength conversion member being surrounded by the first surrounding surface and only a second part of the circumferential edge of the wavelength conversion member being surrounding by the second surrounding surface, the plurality of surrounding surfaces and the wavelength conversion member are dimensioned and positioned such that the wavelength conversion member shields an optical path of the laser light even when the wavelength conversion member is displaced to a maximum extent, and a distance from the plurality of placement surfaces to the lid is set such that the wavelength conversion member shields the optical path of the laser light even when the wavelength conversion member is displaced to a maximum extent.

* * * * *